United States Patent
Tanaka (10) Patent No.: US 8,525,075 B2
(45) Date of Patent: Sep. 3, 2013

(54) LASER IRRADIATION APPARATUS

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 543 days.

(21) Appl. No.: 11/121,000

(22) Filed: May 4, 2005

(65) Prior Publication Data

US 2005/0247684 A1 Nov. 10, 2005

(30) Foreign Application Priority Data

May 6, 2004 (JP) ................................. 2004-137374

(51) Int. Cl.
*B23K 26/00* (2006.01)
*H01L 21/324* (2006.01)

(52) U.S. Cl.
USPC ............... 219/121.73; 250/492.1; 250/492.2; 250/492.23

(58) Field of Classification Search
USPC ............. 219/121.61, 121.65, 121.66, 121.73; 250/492.1, 492.2, 492.23; 438/487
See application file for complete search history.

(56) References Cited

U.S. PATENT DOCUMENTS

| | | | |
|---|---|---|---|
| 4,176,925 A * | 12/1979 | Kocher et al. | 396/547 |
| 4,262,208 A | 4/1981 | Suzki et al. | |
| 4,420,233 A * | 12/1983 | Nomoto et al. | 353/122 |
| 4,734,550 A | 3/1988 | Imamura et al. | |
| 4,743,932 A * | 5/1988 | Matsui | 396/92 |
| 4,786,358 A * | 11/1988 | Yamazaki et al. | 216/48 |
| 4,814,829 A * | 3/1989 | Kosugi et al. | 355/43 |
| 4,851,978 A | 7/1989 | Ichihara | |
| 4,861,964 A | 8/1989 | Sinohara | |
| 4,865,686 A | 9/1989 | Sinohara | |
| 4,879,451 A | 11/1989 | Gart | |

(Continued)

FOREIGN PATENT DOCUMENTS

| | | |
|---|---|---|
| EP | 1055479 A | 11/2000 |
| EP | 1 724 048 A2 | 11/2006 |

(Continued)

OTHER PUBLICATIONS

Akito Hara et al., "Selective Single-Crystalline-Silicon Growth at the Pre-defined Active Regions of TFTs on a Glass by a Scanning DPSS CW Laser Irradiation," Technical Report of IEICE, ED2001-10 SDM2001-10 (Apr. 2001), pp. 21-27.

(Continued)

*Primary Examiner* — Samuel M Heinrich
(74) *Attorney, Agent, or Firm* — Eric J. Robinson; Robinson Intellectual Property Law Office, P.C.

(57) ABSTRACT

The present invention is to provide a laser irradiation apparatus for forming a laser beam which has a shape required for the annealing and which has homogeneous energy distribution, by providing a slit at an image-formation position of a diffractive optical element, wherein the slit has a slit opening whose length is changeable.

The laser irradiation apparatus comprises a laser oscillator, a diffractive optical element, and a slit, wherein the slit has a slit opening whose length in a major-axis direction thereof is changeable, wherein a laser beam is delivered obliquely to a substrate, and wherein the laser beam is a continuous wave solid-state, gas, or metal laser, or a pulsed laser with a repetition frequency of 10 MHz or more.

36 Claims, 7 Drawing Sheets

(56) References Cited

U.S. PATENT DOCUMENTS

| | | |
|---|---|---|
| 4,942,588 A | 7/1990 | Yasui et al. |
| 5,005,969 A | 4/1991 | Kataoka |
| 5,010,230 A | 4/1991 | Uemura |
| 5,059,013 A | 10/1991 | Jain |
| RE33,947 E | 6/1992 | Shinohara |
| 5,134,426 A | 7/1992 | Kataoka et al. |
| 5,145,808 A | 9/1992 | Sameshima et al. |
| 5,237,149 A | 8/1993 | Macken et al. |
| 5,307,184 A | 4/1994 | Nishiwaki et al. |
| 5,448,336 A * | 9/1995 | Shiraishi ............... 355/71 |
| 5,466,908 A * | 11/1995 | Hosoya et al. ........ 219/121.68 |
| 5,608,492 A | 3/1997 | Sato |
| 5,643,801 A | 7/1997 | Ishihara et al. |
| 5,721,416 A | 2/1998 | Burghardt et al. |
| 5,724,122 A * | 3/1998 | Oskotsky ............... 355/67 |
| 5,728,215 A * | 3/1998 | Itagaki et al. ............... 117/104 |
| 5,756,364 A | 5/1998 | Tanaka et al. |
| 5,815,494 A | 9/1998 | Yamazaki et al. |
| 5,932,118 A | 8/1999 | Yamamoto et al. |
| 6,002,523 A | 12/1999 | Tanaka |
| 6,008,101 A | 12/1999 | Tanaka et al. |
| 6,008,144 A | 12/1999 | Shih et al. |
| 6,100,961 A | 8/2000 | Shiraishi et al. |
| 6,168,968 B1 | 1/2001 | Umemoto et al. |
| 6,172,820 B1 | 1/2001 | Kuwahara |
| 6,187,088 B1 | 2/2001 | Okumura |
| 6,246,524 B1 | 6/2001 | Tanaka |
| 6,259,512 B1 | 7/2001 | Mizouchi |
| 6,322,220 B1 | 11/2001 | Sano et al. |
| 6,323,937 B1 | 11/2001 | Sano |
| 6,353,218 B1 | 3/2002 | Yamazaki et al. |
| 6,388,386 B1 | 5/2002 | Kunii et al. |
| 6,393,042 B1 | 5/2002 | Tanaka |
| 6,429,100 B2 | 8/2002 | Yoneda |
| 6,495,405 B2 | 12/2002 | Voutsas et al. |
| 6,504,896 B2 * | 1/2003 | Miyake et al. ............... 378/34 |
| 6,524,977 B1 | 2/2003 | Yamazaki et al. |
| 6,528,397 B1 | 3/2003 | Taketomi et al. |
| 6,563,567 B1 * | 5/2003 | Komatsuda et al. ............ 355/71 |
| 6,573,163 B2 | 6/2003 | Voutsas et al. |
| 6,642,091 B1 | 11/2003 | Tanabe |
| 6,664,147 B2 | 12/2003 | Voutsas |
| 6,676,878 B2 * | 1/2004 | O'Brien et al. ............. 264/400 |
| 6,686,978 B2 | 2/2004 | Voutsas |
| 6,750,423 B2 | 6/2004 | Tanaka et al. |
| 6,777,276 B2 | 8/2004 | Crowder et al. |
| 6,818,484 B2 | 11/2004 | Voutsas |
| 6,818,568 B2 | 11/2004 | Tanaka |
| 6,852,609 B2 | 2/2005 | Yang |
| 6,861,614 B1 | 3/2005 | Tanabe et al. |
| 6,870,125 B2 * | 3/2005 | Doi et al. ............... 219/121.6 |
| 6,885,432 B2 * | 4/2005 | Tsuji ....................... 355/67 |
| 6,891,175 B2 * | 5/2005 | Hiura ...................... 250/492.22 |
| 6,908,835 B2 * | 6/2005 | Sposili et al. ............. 438/487 |
| 6,911,659 B1 * | 6/2005 | Malo ....................... 250/492.1 |
| 6,949,452 B2 | 9/2005 | Hatano et al. |
| 6,961,361 B1 | 11/2005 | Tanaka |
| 6,962,860 B2 | 11/2005 | Yamazaki et al. |
| 6,984,573 B2 | 1/2006 | Yamazaki et al. |
| 6,989,300 B1 | 1/2006 | Tanabe |
| 7,049,184 B2 | 5/2006 | Tanabe |
| 7,063,999 B2 | 6/2006 | Tanabe et al. |
| 7,078,281 B2 | 7/2006 | Tanaka et al. |
| 7,105,048 B2 * | 9/2006 | Yamazaki et al. ............... 117/3 |
| 7,109,069 B2 * | 9/2006 | Kokubo et al. ............. 438/149 |
| 7,164,152 B2 | 1/2007 | Im |
| 7,192,852 B2 | 3/2007 | Hatano et al. |
| 7,223,644 B2 * | 5/2007 | Inoue et al. ............... 438/166 |
| 7,252,910 B2 * | 8/2007 | Hasegawa et al. ............... 430/5 |
| 7,253,120 B2 * | 8/2007 | Glazer et al. ............. 438/758 |
| 7,259,081 B2 * | 8/2007 | Im ....................... 438/487 |
| 7,303,980 B2 | 12/2007 | Yamazaki et al. |
| 7,388,172 B2 | 6/2008 | Sercel et al. |
| 7,402,772 B2 | 7/2008 | Hamada et al. |
| 7,452,788 B2 | 11/2008 | Yamazaki et al. |
| 7,666,769 B2 | 2/2010 | Hatano et al. |
| 7,772,523 B2 * | 8/2010 | Tanaka et al. ............. 219/121.8 |
| 8,173,977 B2 * | 5/2012 | Tanaka ....................... 250/492.2 |
| 2001/0046088 A1 * | 11/2001 | Sano et al. ....................... 359/615 |
| 2002/0102821 A1 | 8/2002 | Voutsas |
| 2003/0068836 A1 * | 4/2003 | Hongo et al. ............... 438/30 |
| 2003/0086182 A1 | 5/2003 | Tanaka et al. |
| 2003/0112322 A1 | 6/2003 | Tanaka |
| 2003/0150843 A1 | 8/2003 | Doi et al. |
| 2003/0153182 A1 | 8/2003 | Yamazaki et al. |
| 2004/0228004 A1 | 11/2004 | Sercel et al. |
| 2005/0035104 A1 | 2/2005 | Tanaka et al. |
| 2005/0169330 A1 | 8/2005 | Hongo et al. |
| 2005/0247684 A1 | 11/2005 | Tanaka |
| 2007/0001228 A1 | 1/2007 | Kokubo et al. |
| 2007/0077696 A1 | 4/2007 | Tanaka et al. |
| 2009/0127477 A1 | 5/2009 | Tanaka |
| 2011/0024406 A1 | 2/2011 | Tanaka et al. |

FOREIGN PATENT DOCUMENTS

| | | | |
|---|---|---|---|
| EP | 1724048 | B | 12/2009 |
| JP | 360044194 | A * | 3/1985 |
| JP | 01-260812 | A | 10/1989 |
| JP | 02-032317 | A | 2/1990 |
| JP | 402084955 | A * | 3/1990 |
| JP | 03-226392 | A | 10/1991 |
| JP | 04-307727 | A | 10/1992 |
| JP | 405052998 | A * | 3/1993 |
| JP | 408101322 | A * | 4/1996 |
| JP | 09-129573 | A | 5/1997 |
| JP | 409210911 | A * | 8/1997 |
| JP | 09-270393 | A | 10/1997 |
| JP | 09-321311 | A | 12/1997 |
| JP | 10113779 | A * | 5/1998 |
| JP | 10-286683 | A | 10/1998 |
| JP | 11-354463 | A | 12/1999 |
| JP | 02000058478 | A * | 2/2000 |
| JP | 2000-091264 | A | 3/2000 |
| JP | 2000-269161 | A | 9/2000 |
| JP | 2000-323428 | A | 11/2000 |
| JP | 2000-343254 | A | 12/2000 |
| JP | 2001-074950 | A | 3/2001 |
| JP | 2001-156017 | A | 6/2001 |
| JP | 2003-142401 | A | 5/2003 |
| JP | 2003-197916 | A | 7/2003 |
| JP | 2003-203876 | A | 7/2003 |
| JP | 2003-209065 | A | 7/2003 |
| JP | 2003-257885 | | 9/2003 |
| JP | 2003-280080 | A | 10/2003 |
| JP | 2003-289080 | A | 10/2003 |
| JP | 2004-056058 | A | 2/2004 |
| JP | 2004-088084 | A | 3/2004 |
| JP | 2004-103628 | A | 4/2004 |
| JP | 2004-226717 | | 8/2004 |
| JP | 2004-289140 | | 10/2004 |
| JP | 2005-217209 | A | 8/2005 |
| JP | 2005-217267 | A | 8/2005 |
| WO | WO2005-090520 | | 9/2005 |
| WO | WO2006/118312 | | 11/2006 |

OTHER PUBLICATIONS

Akito Hara et al., "Ultra-high Performance Poly-Si TFTs on a Glass by a Stable Scanning CW Laser Lateral Crystallization," AM-LCD '01, pp. 227-230.

F. Takeuchi et al., "Performance of Poly-Si TFTs Fabricated by a Stable Scanning CW Laser Crystallization," AM-LCD '01, pp. 251-254.

International Search Report (Application No. PCT/JP2005/006207) Dated July 5, 2005.

Written Opinion (Application No. PCT/JP2005/006207) Dated July 5, 2005.

Office Action (Application No. 200580009439.X) Dated Jan. 4, 2008.

Akito Hara et al., "Selective Single-Crystalline-Silicon Growth at the Pre-defined Active Regions of TFTs on a Glass by a Scanning DPSS CW Laser Irradiation," Technical Report of IEICE, ED2001-10 SDM2001-10 (Apr. 2001), pp. 21-27, Apr. 2001.

Akito Hara et al., "Ultra-high Performance Poly-Si TFTs on a Glass by a Stable Scanning CW Laser Lateral Crystallization," AM-LCD '01, pp. 227-230, Jul. 2001.

F. Takeuchi et al., "Performance of Poly-Si TFTs Fabricated by a Stable Scanning CW Laser Crystallization," AM-LCD '01, pp. 251-254, Jul. 2001.

* cited by examiner

PRIOR ART

FIG.7

PRIOR ART

LASER IRRADIATION APPARATUS

BACKGROUND OF THE INVENTION

1. Field of the Invention

The present invention relates to a laser irradiation apparatus (an apparatus including a laser and an optical system for guiding a laser beam emitted from the laser to an irradiation object) for carrying out annealing to, for example, a semiconductor material homogeneously and effectively.

2. Related Art

In recent years, a technique for manufacturing a thin film transistor (hereinafter referred to as a TFT) over a substrate has been developed drastically, and application to an active matrix display device has been advanced. In particular, a TFT formed using a poly-crystalline semiconductor film is superior in field-effect mobility to a TFT formed using a conventional amorphous semiconductor film, and therefore high-speed operation becomes possible when the TFT is formed using the poly-crystalline semiconductor film. For this reason, it has been tried that a driver circuit, which has been conventionally provided outside a substrate, is formed over the same substrate as a pixel and that the driver circuit controls the pixel.

With the increase in the demand of semiconductor devices, it has been required to manufacture the semiconductor devices in shorter time at lower temperature. As a substrate used in a semiconductor device, a glass substrate, which is less expensive than a quartz substrate, is often used. Although the glass substrate is sensitive to heat and easy to deform due to the heat, a TFT using a poly-crystalline semiconductor film formed over a glass substrate can be obtained easily by crystallizing a semiconductor film formed over the glass substrate at low temperature according to laser annealing.

Moreover, compared with an annealing method using radiant heat or conductive heat, the laser annealing has advantages that processing time can be drastically shortened and a semiconductor film over a substrate is heated selectively and locally so that almost no thermal damage is given to the substrate.

As laser oscillators used in the laser annealing, there are a pulsed laser oscillator and a continuous wave laser oscillator according to the oscillation method. In recent years, it has been known that the crystal grain formed in the semiconductor film becomes larger when using the continuous wave laser oscillator such as an Ar laser or a $YVO_4$ laser than when using the pulsed laser oscillator such as an excimer laser in crystallizing the semiconductor film. When the crystal grain in the semiconductor film becomes larger, the number of crystal grain boundaries in the channel region of the TFT formed using the semiconductor film decreases, and the mobility becomes higher so that more sophisticated devices can be developed. For this reason, the continuous wave laser oscillator is attracting attention.

However, the laser annealing with a continuous wave laser oscillator has a problem in that an annealed state of an irradiation surface becomes inhomogeneous. This is because a laser beam emitted from a continuous wave laser oscillator has Gaussian energy distribution in which the energy is attenuated from the center toward the ends. Accordingly, homogeneous annealing is difficult to achieve.

Figure 6:
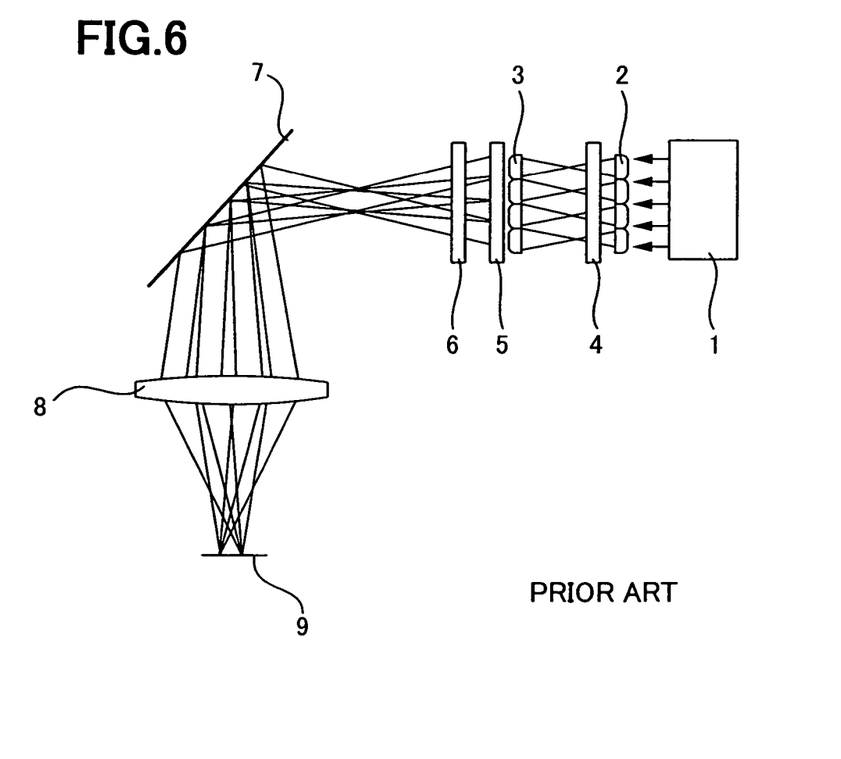
FIG. 6 schematically shows a conventional laser irradiation apparatus.

An apparatus shown in FIG. 6 is known as an apparatus for shaping a laser beam into a linear spot and homogenizing the energy of the laser beam on the irradiation surface. The laser irradiation apparatus has a plurality of cylindrical lens arrays and the like. A laser beam emitted from a laser oscillator 1 is divided into a plurality of beams and condensed by cylindrical lens arrays 2 to 6, and then transmitted through convex cylindrical lenses 5 and 6. The cylindrical lenses 5 and 6 are arranged so that their generating lines intersect with each other. After that, the laser beams are reflected by a mirror 7, and then condensed on an irradiation surface 9 by a doublet cylindrical lens 8 in such a way that the laser beams are combined into one linear beam on the irradiation surface 9. The doublet cylindrical lens 8 consists of two cylindrical lenses.

By performing laser irradiation while displacing the linear beam in its minor-axis direction, the entire surface of an amorphous semiconductor is annealed so that crystallization, enhancement of crystallinity, and activation of an impurity element can be performed.

However, since the conventional laser irradiation apparatus needs to use a plurality of expensive cylindrical lens arrays and to arrange them so as to form a desired linear beam as described above, the apparatus has a problem in that the size and cost of the apparatus increases. Further, the laser annealing is performed by shaping the linear beam into a desired size. When the size of the linear beam is changed in laser annealing, it is necessary to rearrange the optical system or to replace an optical component. Therefore, optical alignment is required every time the size of the linear beam is changed, which consumes a large amount of time. This results in the low throughput (see Reference 1: Japanese Patent Application Laid-Open No: 2003-257885).

Figure 7:
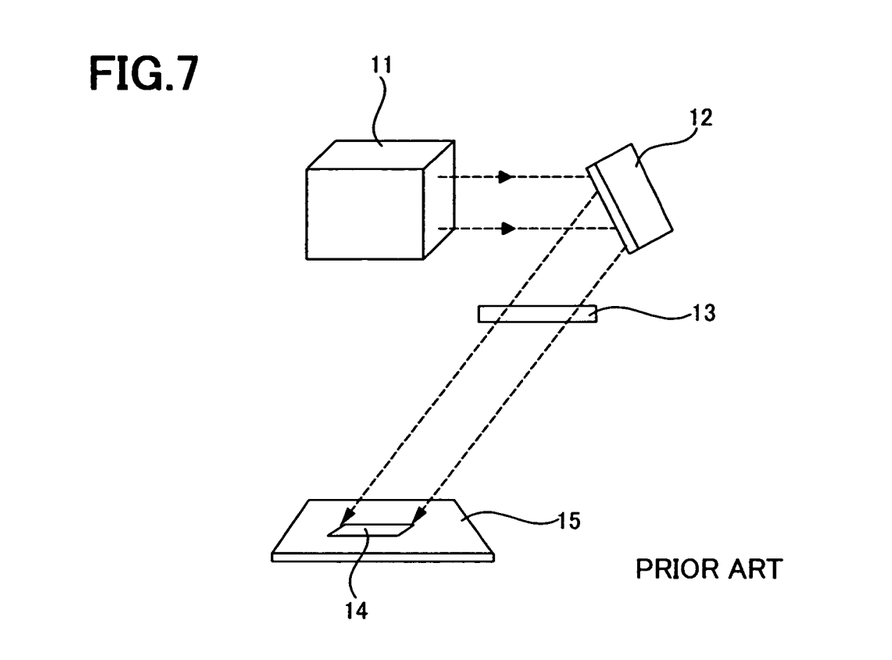
FIG. 7 schematically shows another convention laser irradiation apparatus.

The present inventor has already suggested a laser irradiation apparatus which is compact and less expensive to overcome the problems of the conventional laser irradiation apparatus. FIG. 7 illustrates the laser irradiation apparatus suggested by the present inventor, including a diffractive optical element, which is an element for forming a rectangular beam spot with homogeneous energy distribution.

Specifically, in FIG. 7, a laser beam emitted from a laser oscillator 11 is reflected by a mirror 12, and is then shaped into a rectangular beam spot 14 with homogeneous energy distribution by a diffractive optical element 13. An irradiation surface 15 is provided at the position where the beam 14 with homogeneous energy distribution forms an image (See Reference 1: Japanese Patent Document Laid-Open No. 2003-257885).

However, the above laser irradiation apparatus still has a problem of inhomogeneous energy distribution at the end portions of the rectangular beam. Moreover, since it is necessary to replace the diffractive optical element or other lenses or to rearrange the optical elements in order to change the size of the beam, the optical alignment takes much time, thereby resulting in the low throughput.

SUMMARY OF THE INVENTION

It is an object of the present invention to solve the above problems. Specifically, it is an object of the present invention to provide a laser irradiation apparatus capable of forming a laser beam having a shape required for annealing and having homogeneous energy distribution by providing a slit in which a slit opening (portion) has changeable length at an image-forming position of a diffractive optical element.

To achieve the above object, the present invention employs the following constitution. It is to be noted that the laser annealing method herein described indicates a technique to recrystallize a damaged layer or an amorphous layer in a semiconductor substrate or a semiconductor film, a technique to crystallize an amorphous semiconductor film formed over a substrate by laser irradiation, and a technique to crystallize an amorphous semiconductor film formed over a substrate by laser irradiation after introducing an element for promoting crystallization such as nickel into the amorphous semiconductor film. Moreover, the laser annealing includes a technique applied to planarization or modification of the surface of the semiconductor substrate or the semiconductor film. In this specification, laser beams shaped into a line, an ellipse, and a rectangle on the irradiation surface are respectively referred to as a linear beam, an elliptical beam, and a rectangular beam.

The present invention discloses a laser irradiation apparatus comprising a laser oscillator, a diffractive optical element, a slit, and a condensing lens, wherein the slit has a slit opening whose length is changeable.

The present invention discloses another laser irradiation apparatus comprising a laser oscillator, a diffractive optical element, a slit, and a condensing lens, wherein the slit has a slit opening whose length is changeable and wherein laser beams with various lengths can be delivered to an irradiation surface.

The present invention discloses another laser irradiation apparatus comprising a laser oscillator, a diffractive optical element, a slit, and a condensing lens, wherein the slit has a slit opening whose length is changeable and wherein laser beams with various lengths can be delivered obliquely to an irradiation surface.

In the above constitution of the present invention, the length of the slit opening in a major-axis direction is changeable.

In the above constitution of the present invention, the slit is provided between a diffractive optical element and a condensing lens on the optical path of a laser beam emitted from a laser oscillator.

According to another constitution of the present invention, a laser beam is emitted from a continuous wave laser or a pulsed laser with a repetition frequency of 10 MHz or more. The continuous wave laser is (1) a laser having a single crystal or a poly crystal as a medium or (2) a gas laser such as an Ar laser, a Kr laser, or a $CO_2$ laser. YAG, $YVO_4$, YLF, $YAlO_3$, $GdVO_4$, alexandrite, or Ti:sapphire is given as the single crystal, and YAG, $Y_2O_3$, $YVO_4$, $YAlO_3$, or $GdVO_4$ each of which is doped with one or plural kinds selected from the group consisting of Nd, Yb, Cr, Ti, Ho, Er, Tm, and Ta is given as the poly crystal. The pulsed laser with a repetition frequency of 10 MHz or more is a laser having a single crystal or a poly crystal as a medium. YAG, $YVO_4$, or $GdVO_4$ is given as the single crystal, and YAG, $Y_2O_3$, $YVO_4$, $YAlO_3$, or $GdVO_4$ each of which is doped with one or plural kinds selected from the group consisting of Nd, Yb, Cr, Ti, Ho, Er, Tm, and Ta is given as the poly crystal.

According to the present invention, a laser beam emitted from a laser oscillator is transmitted through a diffractive optical element so that a laser beam having homogeneous energy distribution and having a linear, elliptical, or rectangular cross section is formed at a slit. Then, the laser beam formed at the slit is projected to an irradiation surface so that the laser beam with homogeneous energy distribution is formed on the irradiation surface. With this laser beam employed in the laser annealing, an amorphous semiconductor film over a substrate can be annealed homogeneously.

Further, when the length of the slit opening in the major-axis direction is changed in a direction perpendicular to the traveling direction of the laser beam, the end portions of the rectangular beam can be blocked and the laser beam can be shaped into a desired size. Accordingly, the optical alignment or the replacement of the optical component is no longer necessary, and rectangular beams of various sizes can be formed in short time.

Moreover, since the size of the rectangular beam can be changed easily in accordance with devices to be manufactured, many substrates can be processed in short time, which leads to the high throughput. Furthermore, since homogeneous annealing can be performed on the substrate, the homogeneity of the crystallinity within the substrate can be enhanced. For this reason, the variation in the electric characteristic can be decreased; therefore, the reliability can be enhanced. When the present invention is applied to a mass-production line for TFTs, it is possible to manufacture TFTs with high operating characteristic effectively.

As a result, the operating characteristic and the reliability of the semiconductor device, typically an active matrix type liquid crystal display device, can be enhanced. Moreover, the manufacturing process of the semiconductor device can have a wider margin to boost the yield; therefore, the manufacturing cost of the semiconductor device can be decreased.

DETAILED DESCRIPTION OF THE INVENTION

Embodiment 1

Figure 1:
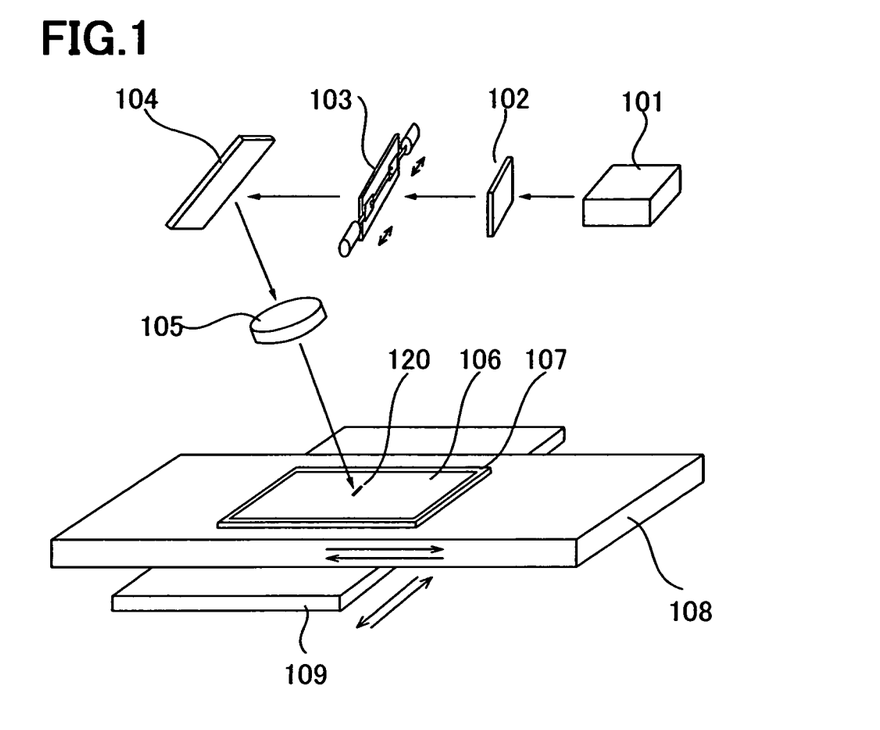
FIG. 1 schematically shows a laser irradiation apparatus according to the present invention.

FIG. 1 shows an example of a laser irradiation apparatus according to the present invention. First, a substrate 107 with a non-single crystal semiconductor film 106 formed is prepared. The substrate 107 is mounted over an X-axis stage 108 and a Y-axis stage 109. The substrate 107 can be moved freely in an X-axis direction and a Y-axis direction by moving the X-axis stage 108 and the Y-axis stage 109 with a motor (not shown) respectively in directions indicated by arrows in FIG. 1.

The laser irradiation apparatus comprises a laser oscillator 101, a diffractive optical element 102, a slit 103, a mirror 104, and a condensing lens 105. As the condensing lens 105, a convex lens (a spherical lens or a convex cylindrical lens) can be used. As the laser oscillator 101, a known continuous wave laser or a solid-state laser can be used. The continuous wave laser is a laser having a single crystal or a poly crystal as a medium. YAG, $YVO_4$, YLF, $YAlO_3$, $GdVO_4$, alexandrite, or Ti:sapphire is given as the single crystal, and YAG, $Y_2O_3$, $YVO_4$, $YAlO_3$, or $GdVO_4$ each of which is doped with one or plural kinds selected from the group consisting of Nd, Yb, Cr, Ti, Ho, Er, Tm, and Ta is given as the poly crystal. In addition, a gas laser such as an Ar laser, a Kr laser, or a $CO_2$ laser can be used. Moreover, among pulsed lasers, pulsed lasers with a repetition frequency of 10 MHz or more having a single crystal or a poly crystal as a medium can be used. YAG, YVO$_4$, or GdVO$_4$ is given as the single crystal, and YAG, Y$_2$O$_3$, YVO$_4$, YAlO$_3$, or GdVO$_4$ each of which is doped with one or plural kinds selected from the group consisting of Nd, Yb, Cr, Ti, Ho, Er, Tm, and Ta is given as the poly crystal. By employing either the continuous wave laser or the pulsed laser with a repetition frequency of 10 MHz or more as the laser oscillator 101, it is possible to form a semiconductor film having crystal grains each of which is large enough to form a TFT in at least one crystal grain.

Not only a continuous wave laser but also a pulsed laser with high repetition frequency may be used in a step of annealing a semiconductor film according to the following reason. It is said that it takes several tens to several hundred ns to solidify a semiconductor film completely after irradiating the semiconductor film with a laser. Therefore, with a pulsed laser having low repetition frequency, a pulsed laser beam is delivered after the semiconductor film irradiated with the previous laser beam is melted and solidified. Accordingly, after the irradiation with the pulsed laser beam, crystal grains grow radially so as to be centrosymmetric at recrystallization. Then, since a crystal grain boundary is formed at a boundary between the adjacent crystal grains, a surface of the semiconductor film becomes uneven.

However, with a pulsed laser having high repetition frequency, a pulsed laser beam is delivered to a semiconductor film after the semiconductor film is melted by the previous laser beam and before the semiconductor film is solidified. Therefore, unlike the case of using the pulsed laser beam having low repetition frequency, an interface between a solid phase and a liquid phase can be moved in the semiconductor film. Therefore, a semiconductor film having crystal grains grown continuously toward the scanning direction of the laser beam can be formed.

The diffractive optical element 102 is also referred to as DOE for short or a diffractive optics. The diffractive optical element 102 is an element by which a spectrum is obtained using diffraction of light and which serves as a condensing lens by forming many grooves in its surface. With the diffractive optical element 102, the laser beam emitted from the continuous wave laser oscillator 101 with Gaussian energy distribution can be shaped into a rectangular beam with homogeneous energy distribution.

Figure 2:
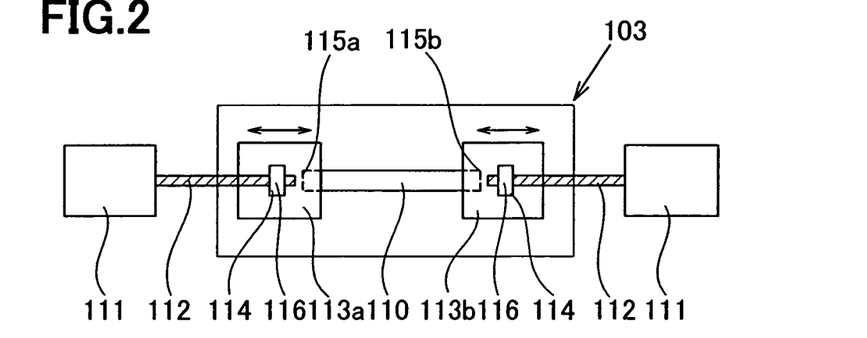
FIG. 2 schematically shows a slit according to the present invention.

The slit 103 is a flat-plate member set at the position where the laser beam forms an image with the diffractive optical element 102. Specifically, the slit 103 is provided at the position where the laser beam forms a rectangular image having homogeneous energy distribution with the diffractive optical element 102. A schematic view of the slit 103 is illustrated in FIG. 2. The slit 103 has a rectangular slit opening 110 in the center, and shielding plates 113a and 113b are provided at opposite end portions 115a and 115b of the slit opening 110 in the major-axis direction to open and close the opposite end portions 115a and 115b. The slit 103 may be provided so that the moving direction of the shielding plates 113a and 113b is parallel to the surface of the diffractive optical element 102 where the laser beam is incident.

A supporting piece 114 having a circular hole 116 with a female screw formed inside is fixed to an approximately center portion of each of the shielding plates 113a and 113b. Moreover, a motor 111 to which one end of a screw axis 112 is fixed and which rotates the screw axis 112 in positive and negative directions freely is provided at a side of the shielding plates 113a or 113b that is opposite to the slit 103. The other end of the screw axis 112 is fixed to the female screw formed in the hole 116 of the supporting piece 114 at the shielding plates 113a and 113b. For this reason, when the motor 111 is driven, the screw axis 112 is rotated to move the shielding plates 113a and 113b of the slit opening 110 in the major-axis direction through the supporting piece 114 as indicated with arrows in the figure. Thus, the length of the slit opening 110 in the major-axis direction can be changed. As the motor 111, a linear motor or the like can be used. Besides, for example, an ultrasonic stage can be used instead of the motor. Further, when the slit is opened and closed at strokes of 100 μm or less, a piezo element can be used.

Thus, the length of the slit opening 110 in the major-axis direction can be changed by moving the shielding plates 113a and 113b in left and right directions at the opposite ends of the slit opening 110. For this reason, it is possible to block a part of the rectangular beam formed with the diffractive optical element 102, particularly a part thereof that has inhomogeneous energy distribution at the opposite end portions in the major-axis direction, as needed and to form a beam having homogeneous energy distribution on the irradiation surface. With this beam, homogeneous annealing can be performed to an amorphous semiconductor film over a substrate.

Figure 3:
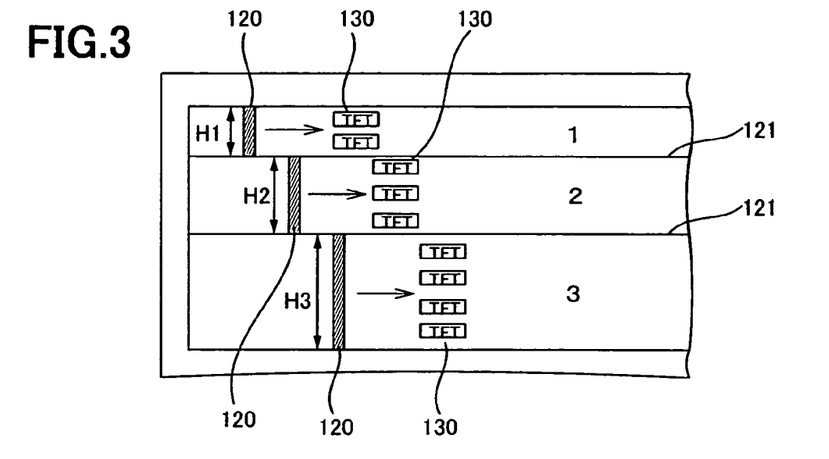
FIG. 3 shows a scanning state of a beam on a substrate.
Figure 4A:
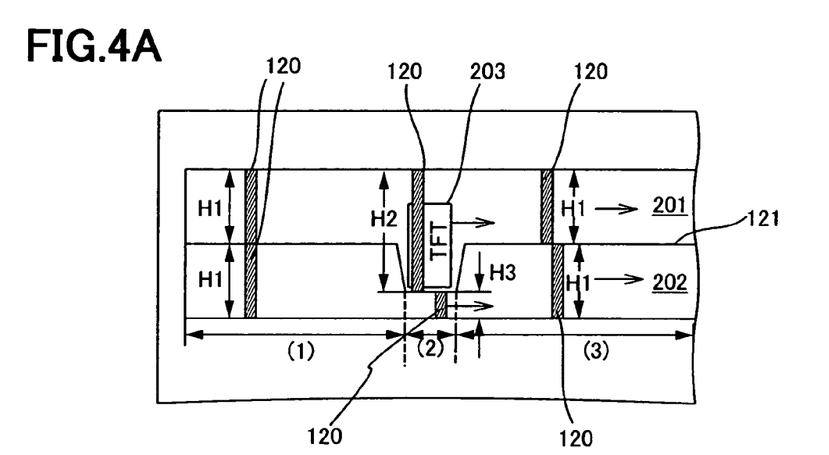
FIGS. 4A and 4B show another scanning state of a beam on a substrate.
Figure 4B:
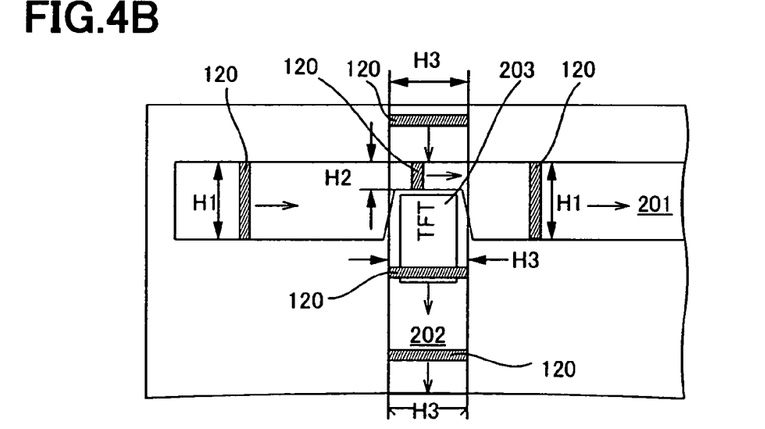

The advantage of opening and closing the slit is not just to block the region of the beam having inhomogeneous energy distribution at the opposite end portions thereof in the major-axis direction. There is another advantage that the length of the beam in the major-axis direction can be adjusted to be a desired length in accordance with the design rule on the irradiation surface. In this case, the optical alignment or the replacement of the optical component is not necessary. Specifically, the beam length H can be changed in accordance with positions where TFTs are to be formed over the substrate 107. FIGS. 3 to 4B show examples in which the beam length H is changed variously. Usually, TFTs are not manufactured at a location 121 where the adjacent beam spots are delivered so as to overlap with each other because the crystallinity is inhomogeneous. However, in some cases, TFTs need to be formed at various locations because of the design. In such a case, when the laser beams having the same beam length H are scanned, TFTs are necessarily formed at the location 121 where the laser beams overlap with each other.

In FIG. 3, the beam length H is changed in each of irradiation regions. That is to say, a beam with short beam length H1 is scanned on an irradiation region 1 so as to crystallize the entire region in which a TFT 130 is to be manufactured in the irradiation region 1. Then, a beam with beam length H2, which is longer than the beam length H1, is scanned on an irradiation region 2 so as to crystallize the entire region in which a TFT 130 is to be manufactured in the irradiation region 2. Further, a beam with beam length H3, which is longer than the beam length H2, is scanned on an irradiation region 3 so as to crystallize the entire region in which a TFT 130 is to be manufactured in the irradiation region 3. Thus, by changing the length of the slit opening 110 to change the beam length H in each of the irradiation regions, the crystallization can be performed so that a TFT 130 is not formed at the location 121 where the adjacent laser beams overlap with each other.

FIG. 4A shows an example in which the beam length H is changed by the shielding plates 113a and 113b in the laser irradiation. In other words, the beam length H is not changed in each of the irradiation regions as shown in FIG. 3, but the beam length H is adjusted by moving the shielding plates 113a and 113b during the laser irradiation in accordance with the arrangement of the TFTs over the substrate so that the end of the beam does not overlap with the region where the TFT is to be formed. In a first irradiation region 201, laser irradiation is performed with the beam length H1 in a region (1) until overlapping a portion where a TFT 203 is to be formed. Then, before the end of the beam reaches a region (2) including the portion where the TFT 203 is to be formed, the beam length is changed by adjusting the shielding plates 113a and 113b to be the beam length H2, which is longer than the beam length H1. By delivering the beam with the beam length H2, it is possible to prevent the end of the beam from overlapping with the portion where the TFT 203 is to be formed. To completely prevent the end of the beam from overlapping with the portion where the TFT 203 is to be formed, the margin may be allowed when changing the beam width. Subsequently, in a region (3) after passing the portion where the TFF 203 is to be formed, the beam length is changed to be the beam length H1 again and the laser irradiation is continued. Thus, the first irradiation region 201 is formed. Similarly, in a second irradiation region 202, laser irradiation is performed with the beam length H1 in the region (1) until overlapping the portion where a TFT 203 is to be formed. Next, just before the end of the beam reaches the region (2) including the portion where the TFT 203 is to be formed, the beam length is changed by adjusting the shielding plates 113a and 113b to be the beam length H3, which is shorter than the beam length H1. With the laser beam having the beam length H3, the laser irradiation is performed so as to avoid the portion where the TFT 203 is to be formed. Then, in the region (3) after passing the portion where the TFT 203 is to be formed, the beam length is changed to be the beam length H1 again and the laser irradiation is continued.

According to the present invention, it is possible to perform laser irradiation while changing the direction where the laser beam is delivered as shown in FIG. 4B. In the first irradiation region 201, similarly to FIG. 4A, the beam length H1 is shortened to be the beam length R2 so as to avoid the portion where the TFT 203 is to be formed. Thus, the first irradiation region 201 is irradiated with the laser beam. After that, the laser irradiation is performed with the laser beam having the beam length H3, which can irradiate the entire portion where the TFT 203 is to be formed, to irradiate a second irradiation region 202 in a direction different from a first irradiation direction, for example a direction perpendicular to the first irradiation direction. Specifically, there are two methods given as examples: (1) a method in which an incident direction of the laser beam is changed by changing a position of an optical system; and (2) a method in which a beam is delivered after changing the direction of a substrate by rotating a stage. Either method is applicable; however the latter method is preferred because the optical system does not need to be replaced or readjusted.

With such a constitution, a laser beam emitted from the laser oscillator 101 is shaped into a line, an ellipse, or a rectangle with homogeneous energy distribution by the diffractive optical element 102. Then, the laser beam shaped thus forms an image once at a slit 103. After transmitting through the slit 103, the laser beam is reflected by the mirror 104, and condensed by the condensing lens 105. Subsequently, the condensed laser beam is delivered obliquely to the substrate 107 with the non-single crystal semiconductor film 106 formed thereover. A laser beam 120 formed on the substrate 107 has a shape of a line, an ellipse, or a rectangle. In this embodiment, the laser beam 120 is a rectangular beam. The laser beam is scanned on the entire surface of the non-single crystal semiconductor film 106 by moving the X-axis stage 108 or the Y-axis stage 109.

The rectangular beam 120 formed on the substrate 107 has a size of approximately 150 to 400 μm in the major-axis direction and approximately 1 to 30 μm in the minor-axis direction. The length thereof in the major-axis direction may be determined with the length thereof in the minor-axis direction so as to secure enough energy density for crystallization. Here, the length of the rectangular beam 120 in the minor-axis direction has an upper limit of approximately 30 μm and a lower limit of approximately 1 μm due to the limitation in the optical design. It is not preferable that the length of the rectangular beam in the minor-axis direction exceeds the upper limit because the surface of the semiconductor film becomes rough. In fact, when the laser beam with a power of 10 W has a length of approximately 10 μm in the minor-axis direction, the length thereof in the major-axis direction is approximately 400 μm. When the laser beam with a power of 3 W has a length of approximately 8 μm in the minor-axis direction, the length thereof in the major-axis direction is approximately 150 μm.

Figure 5:
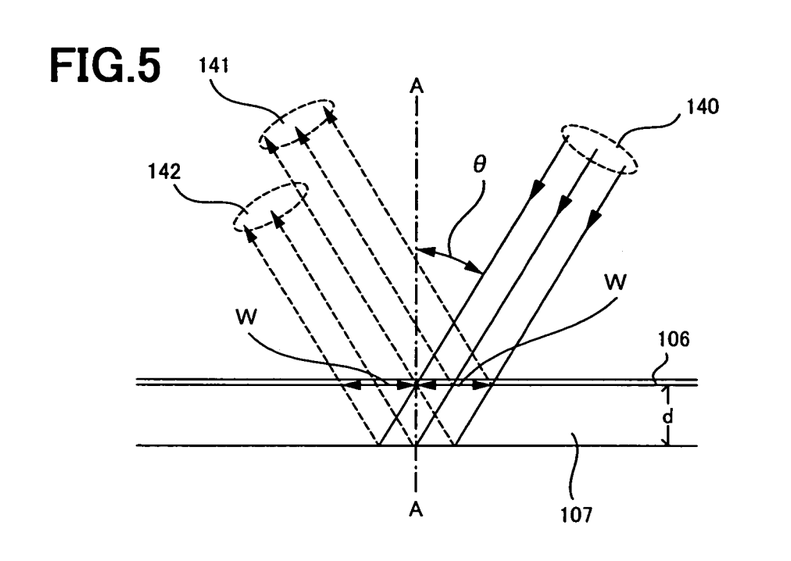
FIG. 5 shows a reflection state of the beam on a substrate.

As described above, the rectangular beam 120 is delivered obliquely to the substrate 107 in order to prevent the interference between the incident beam and a beam reflected on a bottom surface of the substrate 107, which is described as follows with reference to FIG. 5. When an incident beam 140 with the beam length W is made incident obliquely at an incidence angle θ into the substrate 107 with the non-single crystal semiconductor film 106 formed, a top-surface reflected beam 141 generates at a top surface of the substrate 107. Meanwhile, the beam not reflected on the top surface of the substrate 107 travels through the substrate 107, and a bottom-surface reflected beam 142 generates at the bottom surface of the substrate 107. It is known that the interference of beams occurs when the top-surface reflected beam 141 and the bottom-surface reflected beam 142 generated from the top and bottom surfaces respectively overlap with each other.

When the interference occurs, the crystallinity becomes inhomogeneous in the region where the interference occurs. However, when the incidence angle θ is set larger than the predetermined angle as shown in FIG. 5, it is possible to prevent the top-surface reflected beam 141 and the bottom-surface reflected beam 142 from overlapping with each other. Thus, when the incident beam 140 is incident into the substrate 107 after tilting the incident beam 140 so that the top-surface reflected beam 141 and the bottom-surface reflected beam 142 do not overlap with each other, the damage due to the interference can be decreased. It is to be noted that too large incidence angle θ interrupts the crystallization. The appropriate incidence angle θ depends on the thickness d of the substrate 107 and the beam length W. When the substrate 107 has a thickness d of approximately 700 μm and the beam length W is 200 μm, the appropriate incidence angle θ is approximately 20°. However, when the substrate 107 has a thickness d of approximately 700 μm and the beam length W is 1000 μm, the appropriate incidence angle θ is approximately 60°, which is no longer appropriate.

As thus described, the size of a linear, elliptical, or rectangular beam can be adjusted as desired by changing the length of the slit opening 110. Therefore, it is possible to shape the beam in accordance with the size of an irradiation surface and to conduct laser annealing to a region to be used.

The present invention is not limited to the constitution of the above embodiment. The design of the constitution can be changed and modified appropriately without departing from the scope of the present invention.

Embodiment 2

This embodiment shows a process for forming a thin film transistor (TFT) with a laser annealing apparatus according to the present invention.

Figure 8A:
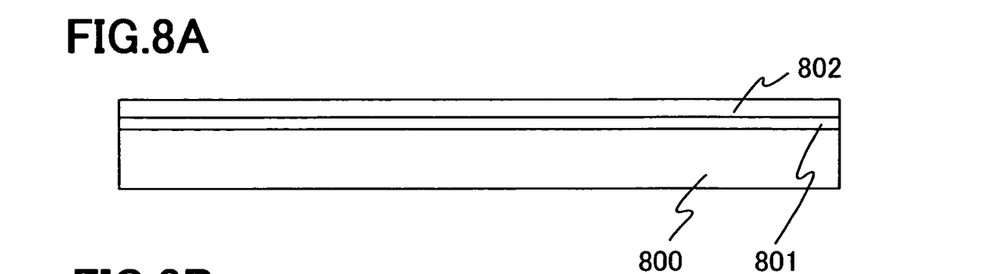
FIGS. 8A to 8D schematically show the steps of forming TFTs according to the present invention.

Initially, a base film 801 is formed over a substrate 800 as shown in FIG. 8A. A glass substrate made from, for example, barium borosilicate glass or alumino borosilicate glass, a quartz substrate, a ceramic substrate, or a stainless substrate can be used as the substrate 800. In addition, although a substrate made from flexible material such as acrylic or plastic tends to be inferior to the above substrates in point of heat resistance, the substrate made from flexible material can be used when the substrate can resist the processing temperature of the following manufacturing steps.

The base film 801 is provided in order to prevent the alkali-earth metal or alkali metal such as Na included in the substrate 800 from diffusing into the semiconductor film. The alkali-earth metal or alkali metal causes an adverse effect on the characteristic of the semiconductor element when it is in the semiconductor. Therefore, the base film is formed with an insulating material such as silicon oxide, silicon nitride, or silicon nitride oxide, which can suppress the diffusion of the alkali-earth metal and alkali metal into the semiconductor film. In the present embodiment, a silicon nitride oxide film is formed in thickness from 10 to 400 nm by a plasma CVD (Chemical Vapor Deposition) method.

In the case of using the substrate containing even a slight amount of the alkali metal or the alkali-earth metal such as the glass substrate or the plastic substrate, it is effective to provide the base film 801 for the purpose of preventing the diffusion of the impurity. When the substrate such as a quartz substrate is used which hardly diffuses the impurity, the base film 801 is not necessarily provided.

Next, an amorphous semiconductor film 802 is formed over the base film 801 in thickness from 25 to 100 nm (preferably from 30 to 60 nm) by a known method (a sputtering method, an LPCVD method, a plasma CVD method, or the like). The amorphous semiconductor film 802 may be formed with silicon or silicon germanium. Silicon is used in this embodiment. When silicon germanium is used, it is preferable that the concentration of germanium is in the range of approximately 0.01 to 4.5 atomic %.

Figure 8B:
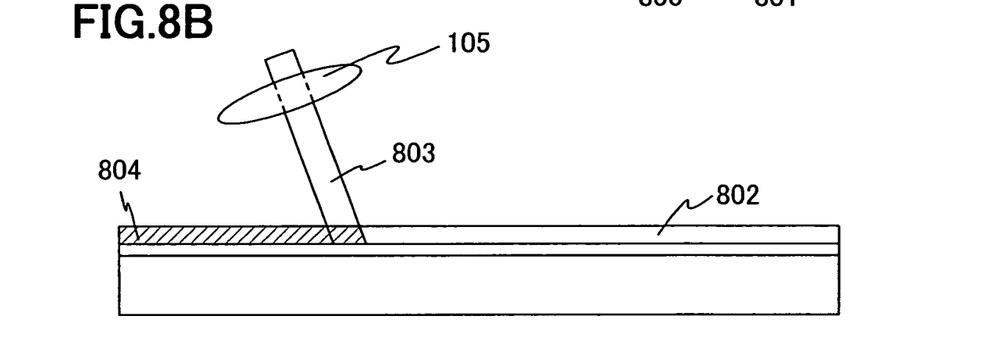

Next, a laser annealing apparatus according to the present invention is used to irradiate the amorphous semiconductor film 802 with a laser beam 803 and to crystallize the amorphous semiconductor film 802 as shown in FIG. 8B. In this embodiment, the laser irradiation is performed using a Nd:YVO$_4$ laser providing 10 W at the second harmonic with the spatial profile of TEM$_{00}$ mode (single transverse mode). This laser irradiation forms crystal grains grown continuously toward the scanning direction. Not only the above-mentioned laser, but also a continuous wave laser or a pulsed laser with repetition frequency of 10 MHz or more may be used. The continuous wave laser is a laser having a single crystal or a poly crystal as a medium; or a gas laser such as an Ar laser, a Kr laser, or a CO$_2$ laser. YAG, YVO$_4$, YLF, YAlO$_3$, GdVO$_4$, alexandrite, or Ti:sapphire is given as the single crystal, and YAG, Y$_2$O$_3$, YVO$_4$, YAlO$_3$, or GdVO$_4$ each of which is doped with one or plural kinds selected from the group consisting of Nd, Yb, Cr, Ti, Ho, Er, Tm, and Ta is given as the poly crystal. As the pulsed laser with a repetition frequency of 10 MHz or more, a laser having a single crystal or a poly crystal as a medium can be used. YAG, YVO$_4$, or GdVO$_4$ is given as the single crystal, and YAG, Y$_2$O$_3$, YVO$_4$, YAlO$_3$, or GdVO$_4$ each of which is doped with one or plural kinds selected from the group consisting of Nd, Yb, Cr, Ti, Ho, Er, Tm, and Ta is given as the poly crystal.

Figure 9A:
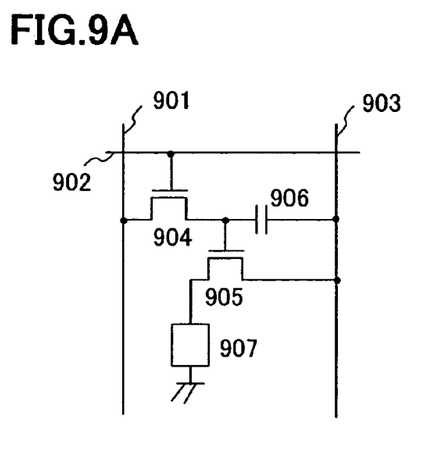
FIGS. 9A to 9D schematically show laser irradiation according to the present invention.
Figure 9B:
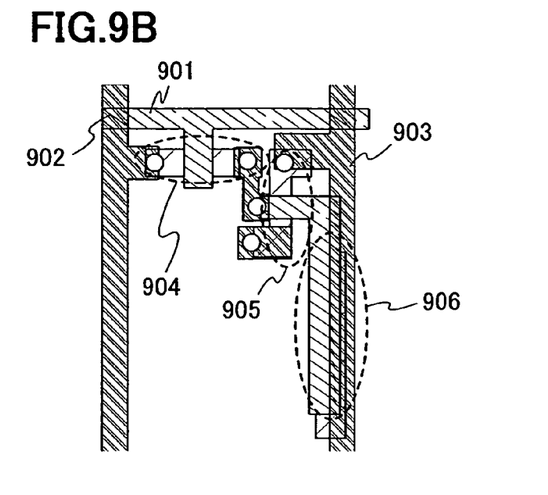
Figure 9C:
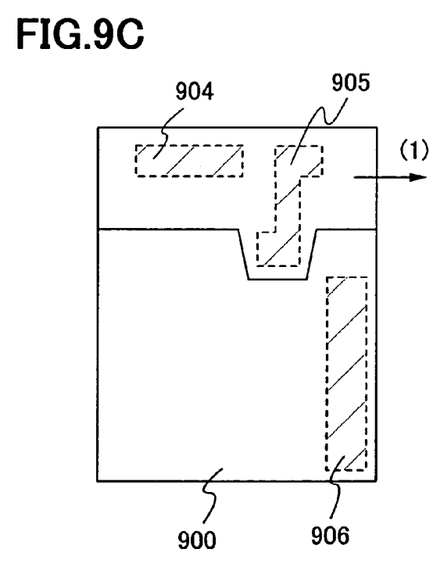
Figure 9D:
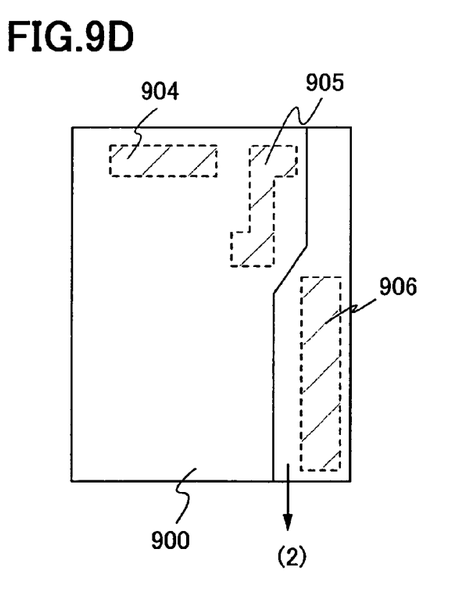

For more compact electronic apparatuses and improvement of their performance, it is necessary to arrange as many TFTs as possible efficiently in the limited area and to shorten wirings. For these reasons, in some cases, the width of the beam is not utilized effectively in the layout. That is to say, when the annealing is conducted using a laser beam with the fixed width, the end of the beam often overlaps with a portion where a TFT is to be formed. When TFTs are formed in accordance with the layout, the crystallization state on the semiconductor film varies within the TFTs. Therefore, when an electronic apparatus is manufactured with these TFTs, such variation significantly affects the performance of the electronic apparatus. For example, in the layout (FIG. 9B) showing a wiring diagram of a light-emitting element shown in FIG. 9A, portions of a semiconductor film where transistors and capacitors are manufactured need to have superior crystallinity. In this case, the laser irradiation may be performed twice as shown in FIGS. 9C and 9D while adjusting the width of the beam. In FIGS. 9A to 9D, a reference numeral 900 denotes a semiconductor film, a reference numeral 901 denotes a source signal line, a reference numeral 902 denotes a gate signal line, a reference numeral 903 denotes a current supply line, a reference numeral 904 denotes a switching TFT, a reference numeral 905 denotes a driver TFT, a reference numeral 906 denotes a capacitor, and a reference numeral 907 denotes a light-emitting element.

In this embodiment, the width of the beam can be freely adjusted by moving the shielding plates 113a and 113b at the slit 103 shown in FIG. 1 so as to correspond to the layout. The width of the beam may be freely adjusted with such a constitution that a layout is inputted in advance to a control device such as a computer for controlling a motor which moves the shielding plates 113a and 113b, the control device sends signals for controlling the motor in accordance with the inputted layout, and the motor, upon the reception of the signals, opens and closes the shielding plates 113a and 113b.

Moreover, since a part of the laser beam having low energy intensity can be blocked with the slit 103, it is possible to irradiate the amorphous semiconductor film over the substrate with the linear, elliptical, or rectangular beam with more than predetermined intensity, and to perform the homogeneous annealing.

Figure 8C:
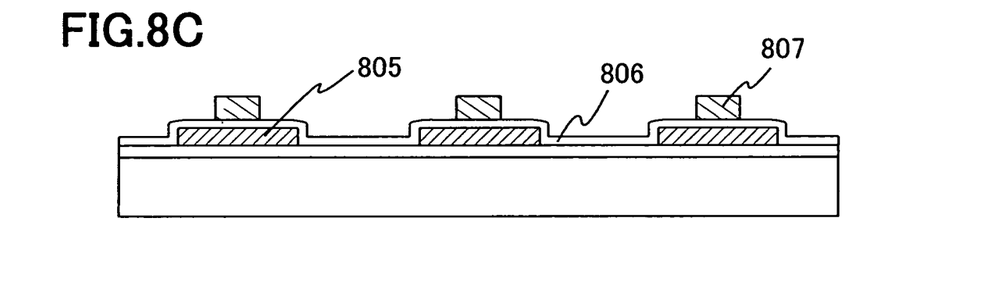

After that, a crystalline semiconductor film 804 formed by the laser irradiation is patterned to form an island-shaped semiconductor film 805. Moreover, a gate insulating film 806 is formed covering the island-shaped semiconductor film 805. The gate insulating film 806 can be formed with silicon oxide, silicon nitride, silicon nitride oxide, or the like by the plasma CVD method or the sputtering method. In this embodiment, a silicon nitride oxide film is formed in 115 nm thick by the plasma CVD method.

Next, a conductive film is formed over the gate insulating film 806, and patterned to form a gate electrode 807. After that, the gate electrode or a resist, which has been formed and patterned, is used as a mask, and impurity elements imparting n-type or p-type conductivity are added selectively. Thus, a source region 808, a drain region 809, an LDD region 810, and the like are formed. According to the above steps, an N-channel TFT 811 and 813, and a P-channel TFT 812 can be formed over the same substrate.

Subsequently, an insulating film 814 is formed as a protective film for those TFTs. As the insulating film 814, a silicon nitride film or a silicon nitride oxide film is formed in a single-layer or multilayer structure having a total thickness of 100 to 200 nm by the plasma CVD method or the sputtering method. In this embodiment, a silicon oxynitride film is formed in 100 nm thick by the plasma CVD method. By providing the insulating film 814, it is possible to obtain a blocking action to block impurity elements such as oxygen or moisture in the air.

Figure 8D:
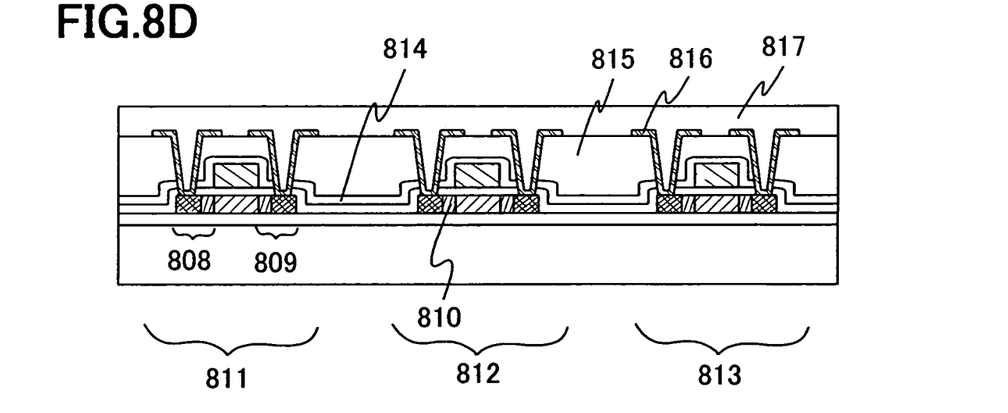

Next, an insulating film 815 is formed. Here, the insulating film 815 is formed with an organic resin film (such as polyimide, polyamide, BCB (benzocyclobuten), acrylic, or siloxane), a TOF film, an inorganic interlayer insulating film (an insulating film containing silicon such as silicon nitride or silicon oxide), a low-k (low dielectric constant) material, or the like. Siloxane is a material whose skeletal structure includes a bond of silicon (Si) with oxygen (O)). As the substituent, an organic substituent containing at least hydrogen, such as an alkyl substituent or aromatic hydrocarbon may be used. A fluoro substituent may be used as the substituent. Moreover, an organic substituent containing at least hydrogen and a fluoro substituent may be used as the substituent. Since the insulating film 815 is formed mainly for the purpose of relaxing and flattening steps due to TFTs formed over the glass substrate, it is preferable to use a film being superior in flattening.

Moreover, an insulating film 814 and an insulating film 815 are patterned by a photolithography method to form a contact hole reaching the impurity region.

Next, a conductive film is formed with a conductive material, and a wiring 816 is formed by patterning the conductive film. After that, an insulating film 817 is formed as a protective film, and thus, a semiconductor device shown in FIG. 8D is completed. It is to be noted that the method for manufacturing a semiconductor device using a laser annealing method according to the present invention is not limited to the manufacturing method described above.

Before the laser crystallization step, a crystallization step using the catalyst element may be performed. As the catalyst element, nickel (Ni), germanium (Ge), iron (Fe), palladium (Pd), tin (Sn), lead (Pb), cobalt (Co), platinum (Pt), copper (Cu), or gold (Au) can be used. The laser irradiation melts an upper part of the semiconductor film but does not melt a lower part of the semiconductor film. Therefore, a crystal remaining without being melted in the lower part of the semiconductor film becomes a crystal nucleus, and the crystallization is promoted starting from the lower part toward the upper part of the semiconductor film.

Therefore, differently from the case in which the semiconductor film is crystallized only by the laser beam, it is possible to enhance the crystallinity of the semiconductor film further and to suppress the roughness of the surface of the semiconductor film after the laser crystallization. Accordingly, the variation of the characteristics of the semiconductor elements to be formed afterward typified by TFTs can be more suppressed and the off-current can be also suppressed.

It is to be noted that the crystallization may be performed in such a way that the heat treatment is performed after the catalyst element is added in order to promote the crystallization and that the laser beam is delivered in order to enhance the crystallinity further. Alternatively, the heat treatment may be omitted. Further alternatively, after the heat treatment for the crystallization, the laser processing may be performed while keeping the temperature of the heat treatment.

Although the present embodiment shows an example in which the laser irradiation method according to the present invention is used to crystallize the semiconductor film, the laser irradiation method may be applied to activate the impurity element doped in the semiconductor film. Moreover, the method for manufacturing a semiconductor device according to the present invention may be applied to the method for manufacturing an integrated circuit or a semiconductor display device.

As transistors for circuits such as a driver and a CPU (central processing unit), transistors each having the LDD structure or a structure in which the LDD overlaps with the gate electrode are preferable. To increase the operation speed, the size of the transistor is desirably decreased. Since the transistor completed by the present embodiment has the LDD structure, the transistor according to the present invention is preferably used for the circuit in which high-speed operation is required.

Embodiment 3

Figure 10A:
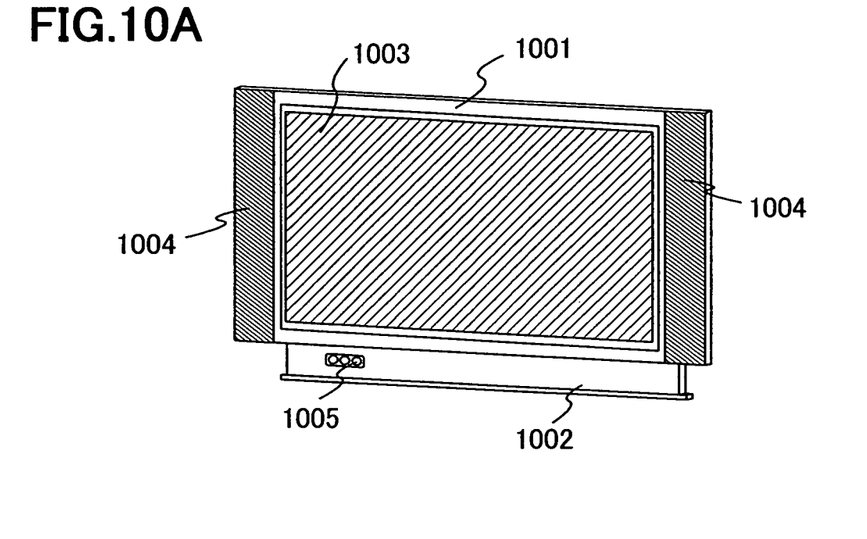
FIGS. 10A to 10C show examples of electronic apparatuses according to the present invention.
Figure 10B:
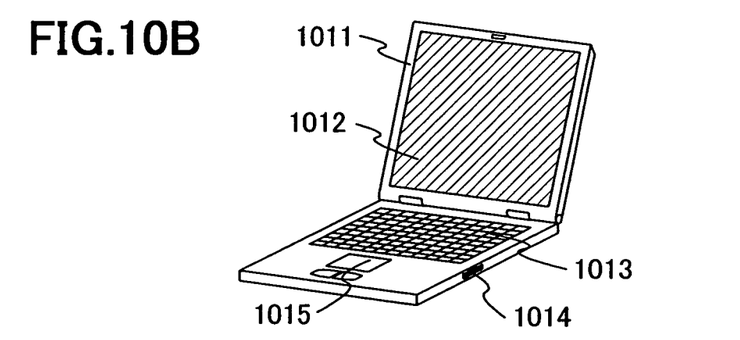
Figure 10C:
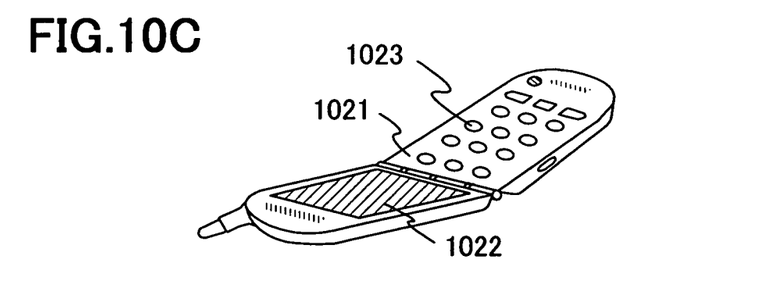

According to the present invention, various electronic apparatuses can be completed with thin film transistors. FIGS. 10A to 10C illustrate the specific examples.

FIG. 10A shows a display device including a chassis 1001, a supporting stand 1002, a display portion 1003, speaker portions 1004, video input terminals 1005, and the like. This display device is manufactured using the thin film transistor manufactured by Embodiment 1 or 2 in the display portion 1003. The display device includes a liquid crystal display device, a light-emitting device, and the like. Specifically, the display device includes all kinds of display device for displaying information such as a display device for a computer, television reception, and advertisement.

FIG. 10B shows a computer including a chassis 1011, a display portion 1012, a keyboard 1013, an external connection port 1014, a pointing mouse 1015, and the like. By using the manufacturing method shown in Embodiment 1 or 2, the present invention can be applied to the display portion 1012 and other circuits. Moreover, the present invention can be applied to the semiconductor device such as a CPU and a memory in the main body. Further, FIG. 10C shows a mobile phone, which is a typical example of mobile terminals. This mobile phone includes a chassis 1021, a display portion 1022, operation keys 1023, and the like. In addition to the above mobile phone, electronic apparatuses such as a PDA (personal digital assistant), a digital camera, and a compact game machine are mobile terminals whose display screens are small. Accordingly, by forming the functional circuits such as a CPU and a memory with fine transistors shown in other embodiment of the present invention, compact and lightweight device can be obtained.

Moreover, the transistor formed in this embodiment can be used as an ID chip. For example, by using the manufacturing method shown in other embodiment, the transistor can be used as an integrated circuit or a memory in the ID chip, or as an ID tag. When the transistor is used as the memory, it is possible to record a circulation process of products and a manufacturing process such as a production area, a producer, a manufacturing date, or a processing method. Moreover, it becomes easier for wholesalers, retailers, and consumers to know such information.

Furthermore, when the transistor is used as the ID tag with radio frequency function mounted, settlement of products and inventory work can be simplified by using the ID tags instead of conventional barcodes.

As thus described, the semiconductor device manufactured according to the present invention can be applied in a wide range, and the semiconductor device manufactured according to the present invention can be applied to various electronic apparatuses in various fields.

What is claimed is:
1. A laser irradiation apparatus comprising:
a laser oscillator;
a diffractive optical element;
a slit; and
a condensing lens, wherein the slit is provided between the diffractive optical element and the condensing lens on an optical path of a laser beam emitted from the laser oscillator, and wherein the slit has shielding plates for shielding end portions of the laser beam so that a length of a slit opening is changeable.

2. A laser irradiation apparatus comprising:
a laser oscillator;
a diffractive optical element;
a slit; and
a condensing lens,
wherein the slit is provided between the diffractive optical element and the condensing lens on an optical path of a laser beam emitted from the laser oscillator, and
wherein the slit has shielding plates for shielding end portions of the laser beam so that a length of a slit opening is changeable to form laser beams with different lengths.

3. A laser irradiation apparatus comprising:
a laser oscillator;
a diffractive optical element;
a slit; and
a condensing lens,
wherein the slit is provided between the diffractive optical element and the condensing lens on an optical path of a laser beam emitted from the laser oscillator, and
wherein the slit has shielding plates for shielding end portions of the laser beam so that a length of a slit opening is changeable to deliver formed laser beams with different lengths obliquely to an irradiation surface.

4. The laser irradiation apparatus according to claim 1, wherein a length of the slit opening in a major-axis direction is changeable.

5. The laser irradiation apparatus according to claim 1, wherein the laser oscillator is a continuous wave solid-state, gas, or metal laser.

6. The laser irradiation apparatus according to claim 1, wherein the laser oscillator is a laser having, as a medium, single-crystal YAG, $YVO_4$, YLF, $YAlO_3$, $GdVO_4$, alexandrite, or Ti:sapphire; or poly-crystal YAG, $Y_2O_3$, $YVO_4$, $YAlO_3$, or $GdVO_4$ each of which is doped with one or more elements selected from the group consisting of Nd, Yb, Cr, Ti, Ho, Er, Tm, and Ta.

7. The irradiation apparatus according to claim 1, wherein the laser oscillator is one selected from the group consisting of a continuous wave Ar laser, Kr laser, and $CO_2$ laser.

8. The irradiation apparatus according to claim 1, wherein the laser oscillator is a pulsed laser with a repetition frequency of 10 MHz or more.

9. The laser irradiation apparatus according to claim 8, wherein the laser oscillator is a laser having, as a medium, single-crystal $GdVO_4$, $YVO_4$, or YAG; or poly-crystal YAG, $Y_2O_3$, $YVO_4$, $YAlO_3$, or $GdVO_4$ each of which is doped with one or more elements selected from the group consisting of Nd, Yb, Cr, Ti, Ho, Er, Tm, and Ta.

10. The laser irradiation apparatus according to claim 2, wherein a length of the slit opening in a major-axis direction is changeable.

11. The laser irradiation apparatus according to claim 2, wherein the laser oscillator is a continuous wave solid-state, gas, or metal laser.

12. The laser irradiation apparatus according to claim 2, wherein the laser oscillator is a laser having, as a medium, single-crystal YAG, $YVO_4$, YLF, $YAlO_3$, $GdVO_4$, alexandrite, or Ti:sapphire; or poly-crystal YAG, $Y_2O_3$, $YVO_4$, $YAlO_3$, or $GdVO_4$ each of which is doped with one or more elements selected from the group consisting of Nd, Yb, Cr, Ti, Ho, Er, Tm, and Ta.

13. The irradiation apparatus according to claim 2, wherein the laser oscillator is one selected from the group consisting of a continuous wave Ar laser, Kr laser, and $CO_2$ laser.

14. The irradiation apparatus according to claim 2, wherein the laser oscillator is a pulsed laser with a repetition frequency of 10 MHz or more.

15. The laser irradiation apparatus according to claim 13, wherein the laser oscillator is a laser having, as a medium, single-crystal $GdVO_4$, $YVO_4$, or YAG; or poly-crystal YAG, $Y_2O_3$, $YVO_4$, $YAlO_3$, or $GdVO_4$ each of which is doped with one or more elements selected from the group consisting of Nd, Yb, Cr, Ti, Ho, Er, Tm, and Ta.

16. The laser irradiation apparatus according to claim 3, wherein a length of the slit opening in a major-axis direction is changeable.

17. The laser irradiation apparatus according to claim 3, wherein the laser oscillator is a continuous wave solid-state, gas, or metal laser.

18. The laser irradiation apparatus according to claim 3, wherein the laser oscillator is a laser having, as a medium, single-crystal YAG, $YVO_4$, YLF, $YAlO_3$, $GdVO_4$, alexandrite, or Ti: sapphire; or poly-crystal YAG, $Y_2O_3$, $YVO_4$, $YAlO_3$, or $GdVO_4$ each of which is doped with one or more elements selected from the group consisting of Nd, Yb, Cr, Ti, Ho, Er, Tm, and Ta.

19. The irradiation apparatus according to claim 3, wherein the laser oscillator is one selected from the group consisting of a continuous wave Ar laser, Kr laser, and $CO_2$ laser.

20. The irradiation apparatus according to claim 3, wherein the laser oscillator is a pulsed laser with a repetition frequency of 10 MHz or more.

21. The laser irradiation apparatus according to claim 19, wherein the laser oscillator is a laser having, as a medium, single-crystal $GdVO_4$, $YVO_4$, or YAG; or poly-crystal YAG, $Y_2O_3$, $YVO_4$, $YAlO_3$, or $GdVO_4$ each of which is doped with one or more elements selected from the group consisting of Nd, Yb, Cr, Ti, Ho, Er, Tm, and Ta.

22. The laser irradiation apparatus according to claim 1, wherein the slit is provided at an image-forming position of the diffractive optical element.

23. The laser irradiation apparatus according to claim 2, wherein the slit is provided at an image-forming position of the diffractive optical element.

24. The laser irradiation apparatus according to claim 3, wherein the slit is provided at an image-forming position of the diffractive optical element.

25. The laser irradiation apparatus according to claim 1, wherein a moving direction of the shielding plates is parallel to a surface of the diffractive optical element where the laser beam is incident.

26. The laser irradiation apparatus according to claim 2, wherein a moving direction of the shielding plates is parallel to a surface of the diffractive optical element where the laser beam is incident.

27. The laser irradiation apparatus according to claim 3, wherein a moving direction of the shielding plates is parallel to a surface of the diffractive optical element where the laser beam is incident.

28. The laser irradiation apparatus according to claim 1, wherein the shielding plates are moved by motors.

29. The laser irradiation apparatus according to claim 2, wherein the shielding plates are moved by motors.

30. The laser irridation apparatus according to claim 3, wherein the shielding plates are moved by motors.

31. The laser irradiation apparatus according to claim 1, wherein the number of shielding plates is only two, and wherein each of the shielding plates is configured to shield one of the end portions.

32. The laser irradiation apparatus according to claim 2, wherein the number of shielding plates is only two, and wherein each of the shielding plates is configured to shield one of the end portions.

33. The laser irradiation apparatus according to claim 3, wherein the number of shielding plates is only two, and wherein each of the shielding plates is configured to shield one of the end portions.

34. The laser irradiation apparatus according to claim 1, further comprising a piezo element:
   wherein the slit is configured to be opened and closed at strokes of 100 µm or less.

35. The laser irradiation apparatus according to claim 1, wherein only a mirror is provided between the slit and the condensing lens.

36. The laser irradiation apparatus according to claim 1, wherein an incident beam emitted from the condensing lens is made incident obliquely into a surface to be irradiated.

* * * * *

UNITED STATES PATENT AND TRADEMARK OFFICE
CERTIFICATE OF CORRECTION

PATENT NO.       : 8,525,075 B2
APPLICATION NO.  : 11/121000
DATED            : September 3, 2013
INVENTOR(S)      : Koichiro Tanaka Page 1 of 1

It is certified that error appears in the above-identified patent and that said Letters Patent is hereby corrected as shown below:

In the Specification

At column 7, line 12, "TFF 203" should be --TFT 203--;

At column 7, line 33, "R2" should be --H2--; and

In the Claims

At column 15, line 1, claim 30, "irridation" should be --irradiation--.

Signed and Sealed this
Fourth Day of February, 2014

Michelle K. Lee
*Deputy Director of the United States Patent and Trademark Office*

UNITED STATES PATENT AND TRADEMARK OFFICE
CERTIFICATE OF CORRECTION

Page 1 of 1

PATENT NO.        : 8,525,075 B2
APPLICATION NO.   : 11/121000
DATED             : September 3, 2013
INVENTOR(S)       : Tanaka

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 647 days.

Signed and Sealed this
Fourteenth Day of March, 2017

Michelle K. Lee
*Director of the United States Patent and Trademark Office*